(12) United States Patent
Park et al.

(10) Patent No.: US 11,054,694 B2
(45) Date of Patent: Jul. 6, 2021

(54) LENS, LIGHT SOURCE DEVICE, BACKLIGHT UNIT, AND ELECTRONIC DEVICE

(71) Applicant: LG Display Co., Ltd., Seoul (KR)

(72) Inventors: KiDuck Park, Paju-si (KR); Younghyun Kim, Seongnam-si (KR)

(73) Assignee: LG DISPLAY CO., LTD., Seoul (KR)

( * ) Notice: Subject to any disclaimer, the term of this patent is extended or adjusted under 35 U.S.C. 154(b) by 149 days.

(21) Appl. No.: 16/039,049

(22) Filed: Jul. 18, 2018

(65) Prior Publication Data

US 2019/0025649 A1 Jan. 24, 2019

(30) Foreign Application Priority Data

Jul. 21, 2017 (KR) .................. 10-2017-0093024

(51) Int. Cl.
| | | |
|---|---|---|
| *G02B 3/02* | (2006.01) | |
| *G02F 1/13357* | (2006.01) | |
| *G02B 19/00* | (2006.01) | |
| *F21V 8/00* | (2006.01) | |
| *F21V 5/04* | (2006.01) | |

(Continued)

(52) U.S. Cl.
CPC .......... *G02F 1/133603* (2013.01); *F21V 5/04* (2013.01); *G02B 6/0018* (2013.01); *G02B 19/0028* (2013.01); *G02B 19/0061* (2013.01); *G02B 19/0066* (2013.01); *G02B 19/0071* (2013.01); *G02F 1/133606* (2013.01);

(Continued)

(58) Field of Classification Search
CPC .......... F21V 7/0091; F21V 5/04; F21V 5/046; F21V 5/007; G02B 19/0066
See application file for complete search history.

(56) References Cited

U.S. PATENT DOCUMENTS 8,118,457 B2 * 2/2012 Kanai ................ G02B 19/0071
362/327
2004/0233665 A1 11/2004 West et al.
(Continued)

FOREIGN PATENT DOCUMENTS

CN 102903833 A 1/2013
CN 103453450 A 12/2013
(Continued)

OTHER PUBLICATIONS

Office Action dated Apr. 11, 2019 issued in the corresponding Japanese Application No. 2018-136739, 4 Pages.
(Continued)

*Primary Examiner* — Andrew J Coughlin
(74) *Attorney, Agent, or Firm* — Polsinelli PC

(57) ABSTRACT

The present disclosure relates to a light diffusion characteristic and a light reflection characteristic, and a light source device, a backlight unit, and an electronic device that include the lens. By causing the light emitted from the light source of the light source device to have both light diffusibility and light directivity using the lens including a lower layer portion having a light diffusion characteristic and an upper layer portion having a light reflection characteristic, it is possible to improve a light emission characteristic of the light source device, and when an optical gap is reduced due to the thickness reduction of the backlight unit, the image quality of the backlight unit can be improved.

19 Claims, 20 Drawing Sheets

(51) Int. Cl.
*H01L 33/58* (2010.01)
*G02F 1/1335* (2006.01)

(52) U.S. Cl.
CPC .. *G02F 1/133605* (2013.01); *G02F 1/133607* (2021.01); *H01L 33/58* (2013.01)

(56) References Cited

U.S. PATENT DOCUMENTS

| | | | |
|---|---|---|---|
| 2013/0027946 A1 | 1/2013 | Tseng et al. | |
| 2014/0168970 A1* | 6/2014 | Choi | F21V 5/04 362/235 |
| 2015/0077976 A1* | 3/2015 | Jiang | G02B 19/0061 362/97.2 |
| 2015/0300594 A1* | 10/2015 | Lee | G02B 6/0021 362/97.1 |
| 2016/0215939 A1 | 7/2016 | Tseng et al. | |

FOREIGN PATENT DOCUMENTS

| | | |
|---|---|---|
| CN | 205299404 U | 6/2016 |
| CN | 106959554 A | 7/2017 |
| JP | 2007-034307 A | 2/2007 |
| JP | 2016-016624 A | 2/2016 |
| KR | 10-2014-0030712 A | 3/2014 |
| KR | 1020140050860 A | 4/2014 |
| KR | 101500924 AB | 3/2015 |
| KR | 101697261 B | 1/2017 |
| TW | 201202790 A1 | 1/2012 |

OTHER PUBLICATIONS

Office Action dated Dec. 16, 2020 issued in Chinese Patent Application No. 201810790153.9 w/Enghsh Translation (28 pages).

Office Action dated Apr. 23, 2021 issued in Korean Patent Application No. 10-2017-0093024 (9 pages).

* cited by examiner

*Light Diffusibility↓ (No Good)   Light Directional Angle ↑ (OK)*

Light Diffusibility ↑ (OK)   Light Directional Angle ↓ (No Good)

ND ELECTRONIC## LENS, LIGHT SOURCE DEVICE, BACKLIGHT UNIT, AND ELECTRONIC DEVICE

CROSS REFERENCE TO RELATED APPLICATION

This application claims priority from Korean Patent Application No. 10-2017-0093024, filed on Jul. 21, 2017, which is hereby incorporated by reference in its entirety for all purposes as if fully set forth herein.

BACKGROUND

Field of the Disclosure

The present disclosure relates to a lens, a light source device, a backlight unit, and an electronic device.

Description of the Background

As the current society has developed into an information-based society, various demands of users for a display device for displaying images is increasing, and various types of display devices such as a liquid crystal display device, a plasma display device, and an organic light-emitting display device are being utilized.

Among such display devices, a liquid crystal display device expresses colors and gray levels by arranging liquid crystals in a display panel and changing the arrangement of the liquid crystals according to a voltage applied to the liquid crystals. Here, the liquid crystal display device may include a structure such as a backlight unit emitting light to the liquid crystals arranged in the display panel.

The backlight unit includes a light source device that emits light, and the light source device is disposed on a side of the display panel (i.e., edge type) or on the lower side of the display panel (i.e., direct type) depending on the type of backlight unit.

Here, when the backlight unit is of the direct-type, a light source device disposed below the display panel includes a light source and a lens disposed on the light source, so that light emitted from the light source reaches the display panel via a diffuser plate or the like.

At this time, as demand for a slim display device increases, the thickness of the backlight unit is reduced, and thus the distance between the light source device of the backlight unit and the diffuser plate needs to be reduced.

Thus, when a backlight unit is also slimmed down for a slim design of a display device, a lens for a light source device needs to have better light emission characteristics (e.g., a light diffusion characteristic and a light direction characteristic).

However, in the case of a lens for the conventional light source device, light may not be uniformly transmitted to a lower front surface of the display panel in a circumstance where the distance between the light source device of the backlight unit and the diffusion plate is short.

That is, in a slim design environment in which the distance between the light source device of the backlight unit and the diffuser plate is short, the conventional light source device and the backlight unit including the same do not have light emission performance (e.g., light diffusion performance and/or light-direction performance) for uniformly supplying light to the whole region of the display panel.

Therefore, there is a problem in that the quality or uniformity of an image displayed on the display panel using the light supplied from the backlight unit greatly deteriorates.

SUMMARY

Accordingly, the present disclosure is to provide a lens, a light source device, a backlight unit, and an electronic device in which excellent image quality is ensured even if the thickness of the backlight unit is reduced due to slimming-down of the display device.

Another aspect of the present disclosure is to provide a lens having a structure for exhibiting complex light emission characteristics, and a light source device, a backlight unit and an electronic device including such a lens.

Still another aspect of the present disclosure is to provide a lens having excellent light diffusibility and high light directivity, and a light source device, a backlight unit, and an electronic device including such a lens.

In one aspect, the present disclosure provides a backlight unit including: a light source; and a lens including, on a bottom surface thereof, a first concave portion in which the light source is disposed and including, on a top surface thereof, a second concave portion, the lens being configured to refract light emitted from the light source in a region between a first point and a second point in a height direction to be diffused to the outside and to reflect at least a part of the light emitted from the light source to send the part to the outside in a region between the second point and the third point; a diffuser plate disposed on the lens to be spaced apart from the lens; and a cover bottom configured to accommodate the light source, the lens, and the diffuser plate therein.

In another aspect, the present disclosure provides a light source unit including: a light source; and a lens including, on a bottom surface thereof, a first concave portion in which the light source is disposed and including, on a top surface thereof, a second concave portion, the lens being configured to refract light emitted from the light source in a region between a first point and a second region in a height direction to be diffused to the outside and to reflect at least a part of the light emitted from the light source to send the part to the outside in a region between the second point and the third point.

In still another aspect, the present disclosure provides a lens for a light source device that includes: a lower layer portion having a light-incident portion configured such that light emitted from a light source is incident thereon, and a convex outer surface; and an upper layer portion positioned on the lower layer portion and having a concave outer surface thereof, the upper layer portion having a reflective surface inclined inward or concave on a part or whole of a top surface.

In still another aspect, the present disclosure provides a lens for a light source device that includes: a light-incident portion provided on a bottom surface of the lens and configured such that the light emitted from a light source is incident thereon; a reflective surface provided on a top surface of the lens to be inwardly inclined or concave; and an outer surface configured such that the light incident on the light-incident portion is emitted there through. The outer surface includes a first outer surface having a convex shape and a second outer surface having a concave shape.

In yet another aspect, the present disclosure provides a lens for a light source device that includes: a light-incident portion provided on a bottom surface of the lens and configured such that the light emitted from a light source is incident thereon; a reflective surface provided on a top surface of the lens to be inwardly inclined or concave; and an outer surface configured such that the light incident on the light-incident portion is emitted therethrough. The outer surface includes a first outer surface having a first curvature and a second outer surface having a second curvature different from the first curvature.

In a further aspect, the present disclosure provides an electronic device including a display panel, and a backlight unit configured to supply light to the lower portion of the display panel. The backlight unit includes a light source and a lens configured such that light emitted from the light source is incident thereon and is emitted therethrough. The lens includes a light-incident portion provided on a bottom surface of the lens and configured such that the light emitted from a light source is incident thereon, a reflective surface provided on a top surface of the lens to be inwardly inclined or concave, and an outer surface configured such that the light incident on the light-incident portion is emitted therethrough. The outer surface includes a first outer surface having a convex shape and a second outer surface having a concave shape.

According to aspects disclosed herein, it is possible to provide a lens including a lower layer portion configured to maximize light diffusibility and an upper layer portion configured to maximize light directivity, so that it is possible to provide a lens and a light source device which have excellent light diffusibility and high light directivity.

According to aspects disclosed herein, by using a light source device including a lens having excellent light diffusibility and high light directivity, so that it is possible to improve the image quality of a backlight unit even if the thickness of the backlight unit is reduced, thereby providing excellent image quality.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
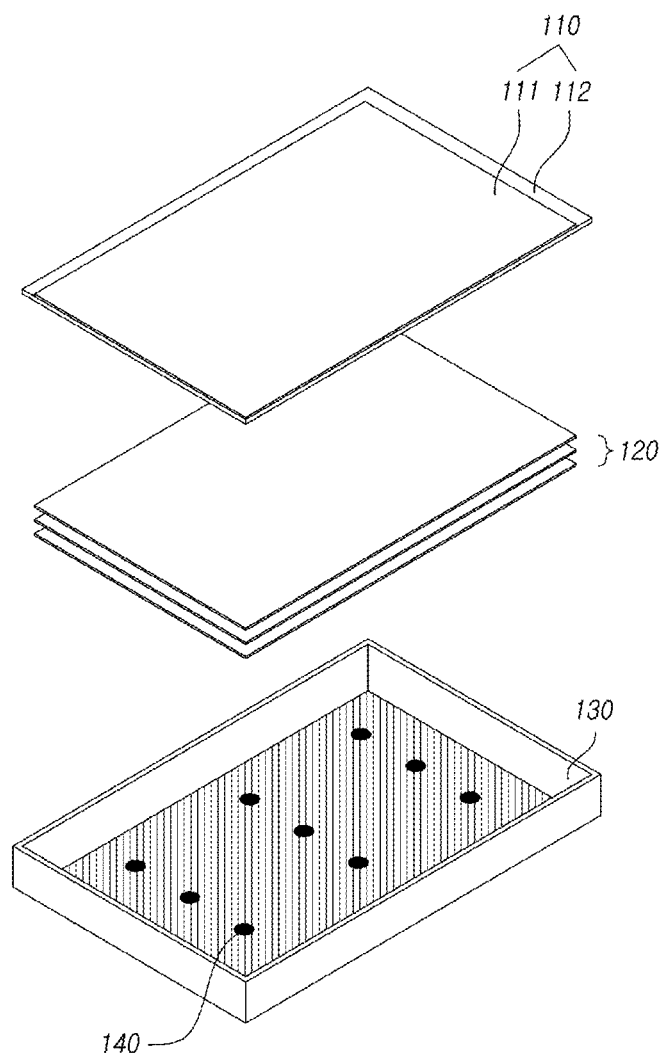
FIG. 1 is a view illustrating a schematic configuration of a display device according to aspects of the present disclosure.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. These terms are merely used to distinguish one component from other components, and the property, order, sequence and the like of the corresponding component are not limited by the corresponding term. In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a view illustrating a schematic configuration of a display device 100 according to an aspect of the present disclosure.

Referring to FIG. 1, a display device 100 according to the present aspect may include a display panel 110 displaying an image, a backlight unit emitting light to the display panel 110, a chassis unit fastening each component of the display device 100, and the like.

The display panel 110 may include a first substrate 111 on which a thin film transistor (TFT), various signal lines, and the like are disposed, and a second substrate 112 on which a color filter is disposed, etc.

The backlight unit may include a light source device 140 disposed under the display panel 110 and emitting light to the display panel 110.

The backlight unit may be of a direct type in which the light source unit 140 is positioned under the display panel 110, or of an edge type in which the light source unit 140 is disposed on a side of the display panel 110.

FIG. 1 illustrates a case where the backlight unit is of a direct type, in which a light source unit 140 including a light source and a lens may be disposed under the display panel 110.

When the backlight unit is of the edge type, the light source device 140 is disposed on a side of the display panel 110 and may include a light guide plate (not illustrated) guiding the light emitted from the light source device 140 to the display panel 110.

The backlight unit may include at least one sheet (or a diffuser plate) 120 such as a lens of the light source device 140 or a diffusion sheet for diffusing light to the upper portion of the light guide plate, and may include a reflector (not illustrated) for increasing light efficiency or the like under the light source device 140 or the light guide plate.

A chassis unit may serve to fasten or protect components of the display panel 110, the backlight unit, and the like, and may include a guide panel (not illustrated), a cover bottom 130, and the like.

Figure 2:
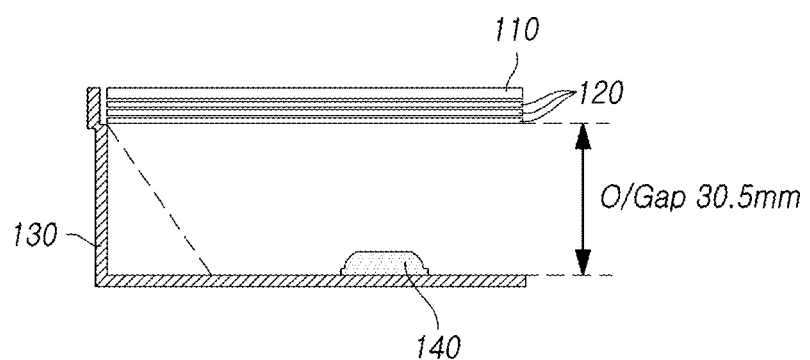
FIG. 2 is a view illustrating an example of a cross section of a backlight unit according to aspects of the present disclosure.

FIG. 2 illustrates an example of a structure of a backlight unit when the backlight unit is of a direct type in the display device 100 according to the present disclosure.

Referring to FIG. 2, the backlight unit according to the present disclosure may include a light source device 140, a diffuser plate 120 disposed apart from the light source device 140, and a cover bottom 130 accommodating the light source device 140 and the diffuser plate 120 therein.

In addition, a reflector (not illustrated) may be disposed on the top surface of the cover bottom 130 in order to improve the light efficiency of the light emitted from the light source device 140.

Here, the distance between the diffusion plate 120 and the reflection plate may also be referred to as an optical gap, and FIG. 2 illustrates an example where the optical gap is 30.5 mm.

The light source device 140 may include a light source emitting light and a lens disposed to enclose the light source and to adjust the path of the light emitted from the light source.

Here, as the light source, an Electro-Luminescence (EL), a Cold Cathode Fluorescent Lamp (CCFL), a Hot Cathode Fluorescent Lamp (HCFL), a Light-Emitting Diode (LED), or the like may be used.

The lens included in the light source device 140 adjusts the movement path of the light emitted from the light source such that the light emitted from the light source reaches the display panel 110 via the diffuser plate 120.

As such a lens, a reflection-type lens having a light reflection characteristic or a diffusion type lens having a light diffusion characteristic may be used.

Figure 3:
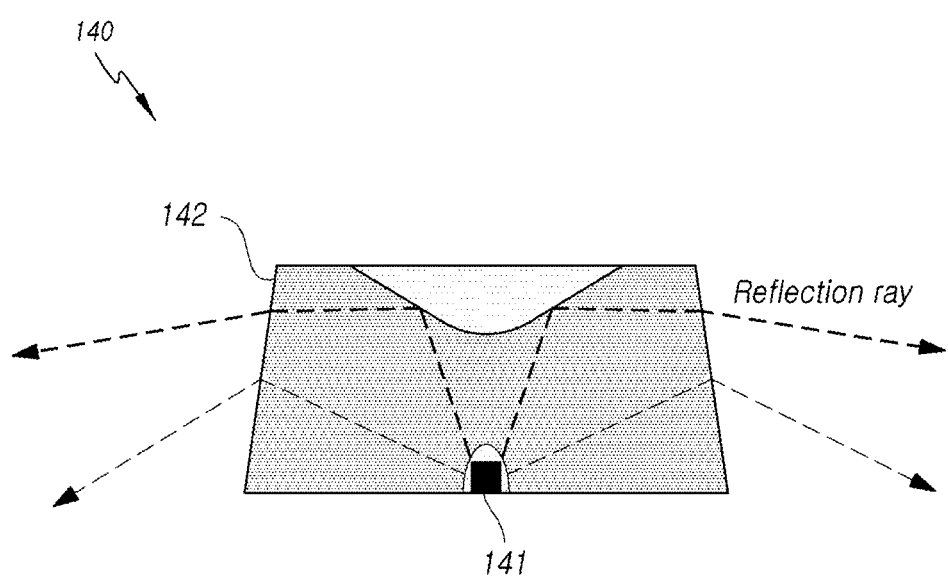
FIG. 3 is a view illustrating an example of a lens structure having a light reflection characteristic in a light source device according to aspects of the present disclosure.
Figure 4:
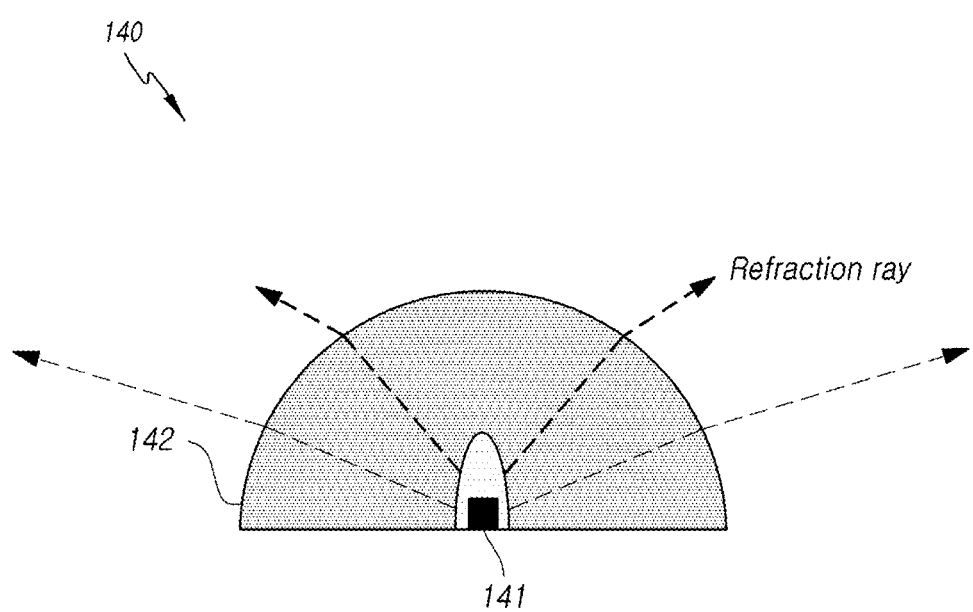
FIG. 4 is a view illustrating an example of a lens structure having a light diffusion characteristic in the light source device according to aspects of the present disclosure.

FIGS. 3 and 4 illustrate an example of the structure of the light source device 140 of the backlight unit according to the present disclosure, in which FIG. 3 illustrates the light source device 140 using a reflection-type lens having a light reflection characteristic, and FIG. 4 illustrates the light source device 140 using a diffusion-type lens having a light diffusion characteristic.

Referring to FIG. 3, the light source apparatus 140 according to the present disclosure includes a light source 141 and a lens 142 disposed on the light source 141.

The lens 142 having a light reflection characteristic includes, on the bottom surface thereof, a concave portion in which the light source 141 is disposed and may include, on the top surface thereof, a concave portion for light reflection.

In addition, the outer surface of the lens 142 having a light reflection characteristic may have a linear shape without being bent in the height direction.

The light emitted from the light source 141 may be sent to the outside through the outer surface of the lens 142 or may be reflected by the concave portion located on the top surface of the lens 142 and may be sent to the outside.

When the lens 142 having such a light reflection characteristic is used in the light source device 140, the directivity of the light emitted from the light source 141 can be improved. However, the diffusibility of the light emitted from the light source 141 is weakened, and thus the brightness of the light emitted from the backlight unit to the display panel 110 may deteriorate.

FIG. 4 illustrates an example of the light source device 140 capable of preventing the deterioration of the brightness of the light emitted from the backlight unit to the display panel 110.

Referring to FIG. 4, the light source device 140 may include a lens 142 disposed to enclose the light source 141 and the light source 141 and having a light diffusion characteristic.

The lens 142 having the light diffusion characteristic may include, on the bottom surface thereof, a concave portion in which the light source 141 is disposed.

In addition, the outer surface of the lens 142 having the light reflection characteristic may have a shape bent in the vertical direction. In one example, the lens 142 having the light diffusion characteristic may have a hemispherical shape.

The light emitted from the light source 141 may be sent to the outside through the outer surface of the lens 142, and may be refracted and sent out from the outer surface of the lens 142. Accordingly, the light emitted from the light source 141 is diffused by refraction at the outer surface of the lens 142, so that the diffusibility of the light emitted from the light source 141 can be improved.

That is, when the lens 142 having the light diffusion characteristic is used in the light source device 140, the directivity of the light emitted from the light source 141 deteriorates, but the diffusibility is improved, so that the luminance of the light emitted from the backlight unit to the display panel 110 can be improved.

On the other hand, as demand for slimming down the display device 100 increases, the thickness of the backlight unit included in the display device 100 to which slimming is applied can be reduced.

Figure 5:
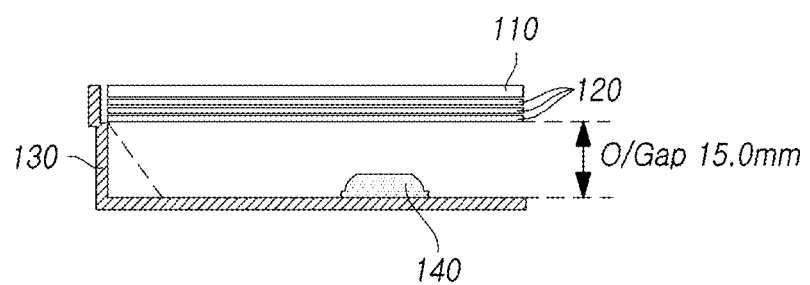
FIG. 5 is a view illustrating an example of a cross section of the backlight unit according to aspects of the present disclosure.

FIG. 5 illustrates an example of a cross-section of a backlight unit when sliming is applied to the backlight unit according to the present disclosure.

Referring to FIG. 5, as the thickness of the backlight unit decreases, the distance between the diffuser plate 120 and the reflector decreases in the backlight unit. FIG. 5 illustrates a case in which the optical gap is 15.0 mm.

When the optical gap is reduced as described above, there is a problem in that the light directivity is weak and the image quality of the backlight unit deteriorates when the light source device 140 uses the lens 142 having the light diffusion characteristic.

The light source device 140 according to the present disclosure can improve the image quality of the backlight unit in which the optical gap is reduced by using the lens 142 capable of simultaneously providing light diffusibility and optical directivity.

Figure 6:
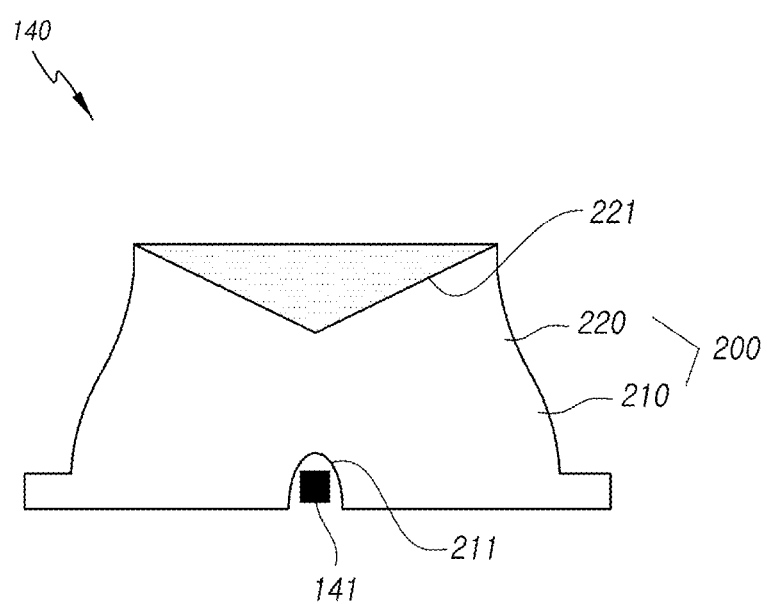
FIG. 6 is a view illustrating an example of a lens structure having a light reflection characteristic and a light diffusion characteristic in the light source device according to aspects of the present disclosure.

In the case where the light source device 140 according to the present disclosure uses a lens 200 (hereinafter, referred to as a "hybrid lens") that simultaneously provides light diffusibility and light directivity, FIG. 6 illustrates an example of the structure of the hybrid lens 200.

Referring to FIG. 6, the hybrid lens 200 according to the present disclosure may be divided into a lower layer portion 210 and an upper layer portion 220 according to the light emission characteristics thereof.

The lower layer portion 210 includes, in the bottom surface thereof, a first concave portion (or a light incident portion 211) in which a light source 141 is disposed, and the upper layer portion 220 includes, in the upper surface thereof, a second concave portion (or a reflective surface 221) for reflecting light.

The outer surface of the lower layer portion 210 and the outer surface of the upper layer portion 220 may be convex or concave. For example, the outer surface of the lower layer portion 210 may have a convex shape and the outer surface of the upper layer portion 220 may have a concave shape.

Since the convex shapes (or the convex directions, concave shapes, or concave directions) of the respective outer surfaces of the upper layer portion 220 and the lower layer portion 210 are different from each other, the light emission characteristics on the outer surface of the upper layer portion 220 may be different from the light emission characteristics on the outer surface of the lower layer portion 210.

Meanwhile, the upper layer portion 220 and the lower layer portion 210 may be distinguished from each other according to the convex shapes of the outer surfaces thereof, by may be integrally formed.

Alternatively, the upper and lower layer portions 220 and 210 may be separate portions, which are joined together during lens fabrication.

In this case, the upper layer portion 220 may be a first material having a first refractive index, and the lower layer portion 210 may be a second material having a second refractive index.

Here, the first material and the second material may be the same or different from each other.

When the first material and the second material are the same, the first refractive index and the second refractive index are the same.

When the first material and the second material are different from each other, the first refractive index and the second refractive index may be the same, and the first refractive index and the second refractive index may be different from each other.

When the first refractive index and the second refractive index are different from each other, the light refraction characteristic on the outer surface of the upper layer 220 may be different from the light refraction characteristic on the outer surface of the lower layer 210.

By variously selecting the first material having the first refractive index and the second material having the second refractive index, it is possible to control the light refraction characteristic on the outer surface of the upper layer portion 220 and the light refraction characteristic on the outer surface of the lower layer portion 210.

As described above, the hybrid lens 200 according to the present aspects may have an outer surface whose convex shape changes once (e.g., convex outwards->convex inwards).

Meanwhile, in order to control the light emission characteristics variously, the hybrid lens 200 according to the present disclosure may have an outer surface whose convex shape changes twice or more (e.g., convex outwards→convex inwards→convex outwards).

Hereinafter, a specific aspect of the hybrid lens 200 according to the present disclosure will be described with reference to FIGS. 7 to 11. The upper layer portion 220 and the lower layer portion 210 are shown separately for convenience of explanation. As described above, however, the upper layer portion 220 and the lower layer portion 210 may be made of the same material or different materials, or may be formed in various forms such as a separable type and an integral type.

Figure 7:
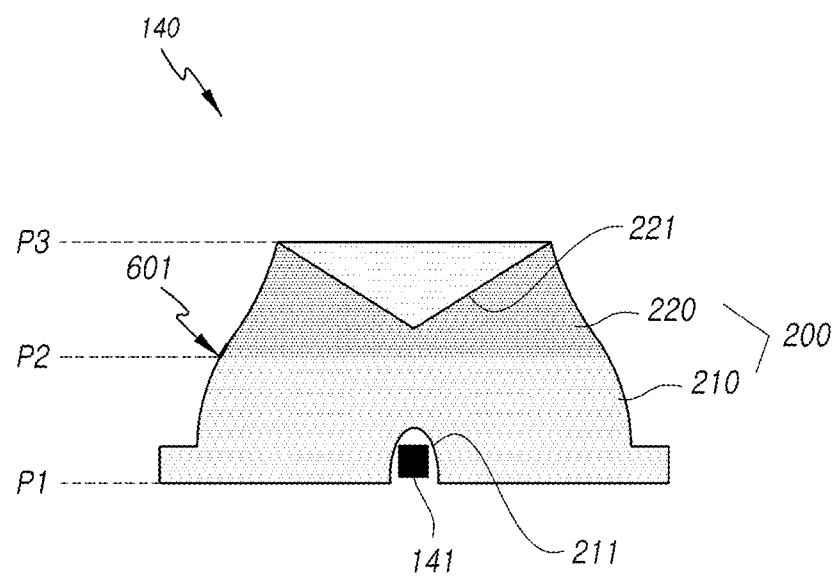
FIG. 7 is a view illustrating a first aspect of a lens structure having a light reflection characteristic and a light diffusion characteristic in the light source device according to aspects of the present disclosure.

FIG. 7 illustrates a first example of the structure of the hybrid lens 200 in the case where the light source device 140 according to the present disclosure uses the hybrid lens 200 that simultaneously provides light diffusibility and light directivity.

Referring to FIG. 7, the hybrid lens 200 according to the first aspect includes a lower layer portion 210 having a light diffusion characteristic and an upper layer portion 220 having a light reflection characteristic.

The lower layer portion 210 having the light diffusion characteristic includes, on the bottom surface thereof, a first concave portion 211 in which a light source 141 is disposed, and the upper layer portion 220 having the light reflection characteristic includes, on the top surface thereof, a second concave portion 221 for light reflection.

Here, the lowest point of the hybrid lens 200 will be referred to as a "first point P1," and the portion corresponding to the boundary between the lower layer portion 210 and the upper layer portion 220 will be referred to as a "second point P2," and the highest point of the hybrid lens 200 will be referred to as a "third point P3."

That is, the hybrid lens 200 according to the first aspect sends out light through the lower layer portion 210 having the light diffusion characteristic in the region between the first point P1 and the second point P2 in the height direction, and sends out light through the upper layer 220 having the light reflection characteristic in the region between the second point P2 and the third point P3.

The lower layer portion 210 of the hybrid lens 200 may have a convex shape with a constant curvature on the outer surface thereof.

For example, as illustrated in FIG. 7, the outer surface of the lower layer 210 may be convexly curved in shape from the first point P1 to the second point P2, through which the light emitted from the light source 141 may be refracted and diffused on the outer surface of the lower layer portion 210.

That is, the lower layer portion 210 of the hybrid lens 200 according to the first aspect provides the light diffusion property, so that the light diffusibility of the light source device 140 using the hybrid lens 200 can be improved.

The upper layer portion 220 of the hybrid lens 200 may have a concave shape with a constant curvature on the outer surface thereof.

For example, as illustrated in FIG. 7, the outer surface of the upper layer portion 220 may be concavely curved in a shape from the second point P2 to the third point P3.

Therefore, the second point P2 corresponding to the boundary between the lower layer portion 210 and the upper layer portion 220 may be a point at which the curvature changes as indicated by arrow 601.

The upper layer portion 220 of the hybrid lens 200 may include, on the top surface thereof, a second concave portion 221 for reflection of light.

The second concave portion 221 included in the upper layer portion 220 may be configured such that the lowest point of the second concave portion 221 may be located between the second point P2 and the third point P3, and the entire surface of the concave portion 221 may be located lower than the third point P3.

The light emitted from the light source 141 by the second concave portion 221 included in the upper layer portion 220 is reflected by the second concave portion 221 and is sent to the outside.

That is, the upper layer portion 220 of the hybrid lens 200 is configured such that the lowest point of the second concave portion 221 is located at a position higher than the second point P2, which is the boundary with the lower layer 210, so that the lower layer portion 210 of the hybrid lens 200 can provide a light diffusion characteristic and the upper layer portion 220 can provide a light reflection characteristic.

In addition, the entire surface of the second concave portion 221 is located lower than the third point P3, so that it is possible to increase the light reflection area, thereby improving the light reflection characteristic.

Therefore, the light source device 140 using the hybrid lens 200 according to the first aspect of the present disclosure is capable of making the light emitted from the light source 141 have simultaneously diffusibility and directivity, so that the image quality of the backlight unit with a reduced optical gap can be improved.

Figure 8:
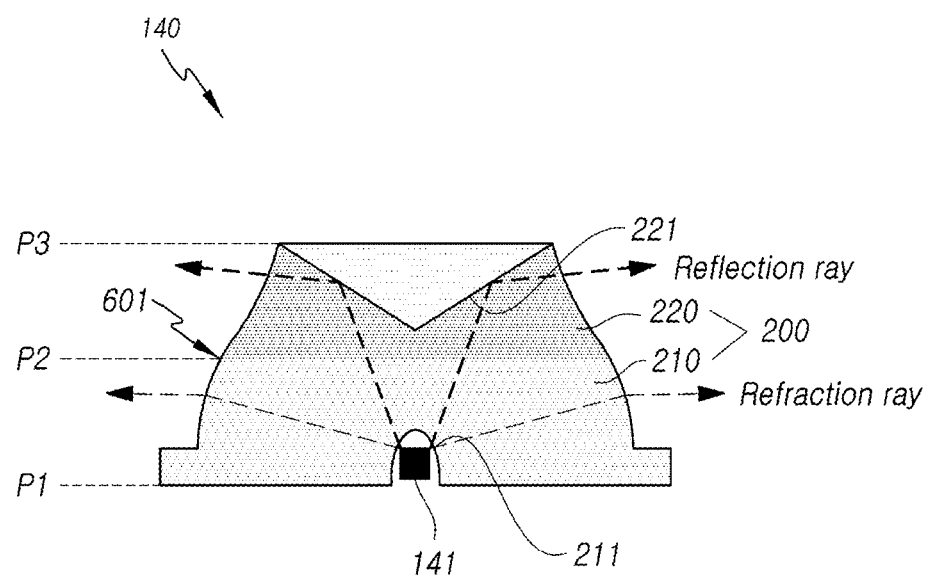
FIG. 8 is a view illustrating an example of a path through which light emitted from the light source moves by the lens according to the first aspect.

FIG. 8 illustrates an example of the movement path of light emitted from the light source 141 in the light source device 140 using the hybrid lens 200 according to the first aspect of the present disclosure.

Referring to FIG. 8, the light emitted from the light source 141 of the light source device 140 is transmitted to the outside through the hybrid lens 200.

When the light emitted from the light source 141 is sent to the outside through the outer surface between the first point P1 and the second point P2 of the hybrid lens 200 (i.e. when the light is sent to the outside only through the region corresponding to the lower layer portion of the hybrid lens 200), the light is diffused by the refraction on the outer surface of the hybrid lens 200 (refraction ray).

In addition, when the light emitted from the light source 141 is sent to the outside through the regions corresponding to the lower layer portion 210 and the upper layer portion 220 of the hybrid lens 200, at least a part of the light is reflected from the second concave portion 221 of the upper layer portion 220 and is emitted to the outside through the outer surface of the upper layer portion 220 (reflection ray).

Accordingly, the light sent to the outside through one hybrid lens 200 is capable of having light diffusibility or light directivity depending on the area through which the light passes in the hybrid lens 200.

As the light emitted from the light source device 140 has both light diffusivity and light directivity, the image quality of the backlight unit can be improved even when the optical gap of the backlight unit is reduced.

Figure 9:
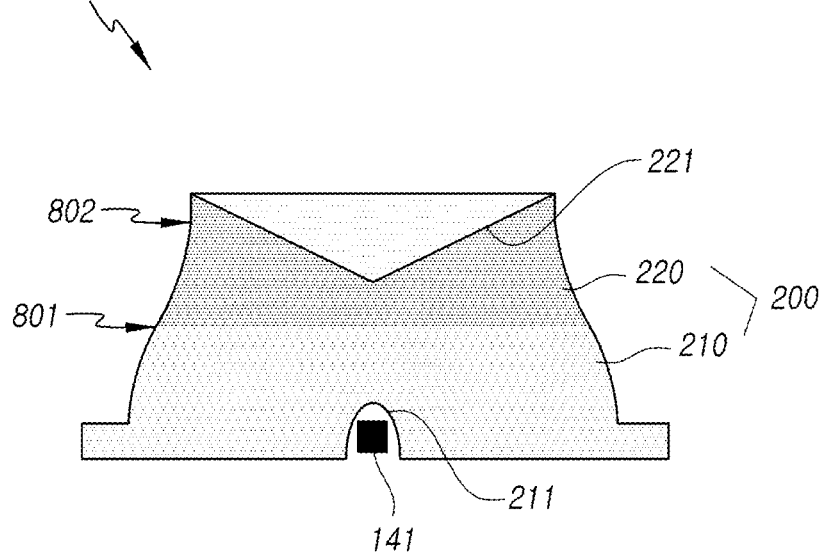
FIG. 9 is a view illustrating a second aspect of a lens structure having a light reflection characteristic and a light diffusion characteristic in the light source device according to aspects of the present disclosure.

FIG. 9 illustrates a second aspect of the structure of the hybrid lens 200 when the light source device 140 according to the present disclosure uses the hybrid lens 200.

Referring to FIG. 9, the light source device 140 using the hybrid lens 200 according to the second aspect includes a light source 141 and a hybrid lens 200 disposed to enclose the light source 141.

The hybrid lens 200 includes a lower layer portion 210 having a light diffusion characteristic and an upper layer portion 220 having a light reflection characteristic.

The outer surface of the lower layer portion 210 having a light diffusion characteristic may have a convex shape with a constant curvature, and the outer surface of the upper layer portion 220 having a light reflection characteristic may have a concave shape with a constant curvature.

Here, the upper layer portion 220 of the hybrid lens 200 according to a second aspect may include a point where the curvature changes on the outer surface thereof.

That is, a point at which the curvature of the outer surface changes may exist between a second point P2 and a third point P3 corresponding to the boundary between the lower layer 210 and the upper layer 220, and the point where the curvature of the outer surface changes between the second point P2 and the third point P3 may be located higher than the lowest point of a second concave portion 221 of the upper layer portion 220.

Therefore, in the hybrid lens 200 according to the second aspect, the curvature of the outer surface changes at the second point P2 as indicated by an arrow 801 in FIG. 9, and a point where the curvature of the outer surface changes may be included between the second point P2 and third points P3 as indicated by an arrow 802.

The light directivity of the light sent to the outside through the upper layer portion 220 can be further improved by including the point where the curvature changes on the outer surface of the upper layer portion 220 of the hybrid lens 200 providing the light reflection characteristic.

Figure 10:
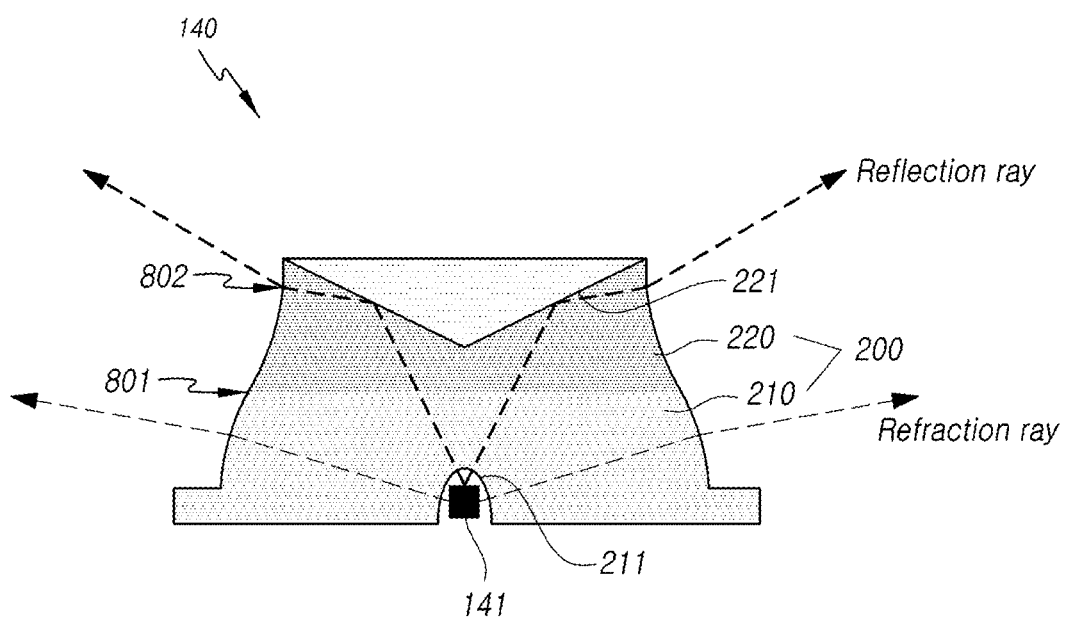
FIG. 10 is a view illustrating an example of a path through which light emitted from the light source moves by the lens according to the second aspect.

FIG. 10 illustrates an example of the movement path of light emitted from the light source 141 in the light source device 140 using the hybrid lens 200 according to the second aspect.

Referring to FIG. 10, the hybrid lens 200 according to the second aspect includes a lower layer portion 210 having a light diffusion characteristic and an upper layer portion 220 having a light reflection characteristic.

When the light emitted from the light source 141 is sent to the outside through only the region corresponding to the lower layer portion 210 of the hybrid lens 200, the light is diffused by refraction on the outer surface of the lower layer portion 210 (refraction ray).

When the light emitted from the light source 141 is sent to the outside through the regions corresponding to the lower layer portion 210 and the upper layer portion 220 of the hybrid lens 200, the light is reflected from the second concave portion 221 of the upper layer portion 220 and is emitted to the outside (reflection ray).

Here, by including the point where the curvature changes on the outer surface of the upper layer portion 220, the directivity of the light sent to the outside through the outer surface of the upper layer portion 220 can be further improved.

That is, since the directivity of the light reflected by the second concave portion 221 of the upper layer portion 220 and sent to the outside varies according to the curvature of the outer surface of the upper layer portion 220, the range of a directional angle of the light emitted through the outer surface of the upper layer portion 220 can be enlarged.

Therefore, with the hybrid lens 200 according to the second aspect, by simultaneously providing the light diffusibility and the light directivity and further improving the light directivity, it is possible to prevent deterioration of the image quality, which is caused as the lens 142 lacking light directivity is used in the backlight unit in which the optical gap is reduced.

Meanwhile, in the hybrid lens 200 according to the present aspects, the outer surface of the lower layer portion 210 for providing light diffusibility may have a convex shape, but may have a concave shape.

Figure 11:
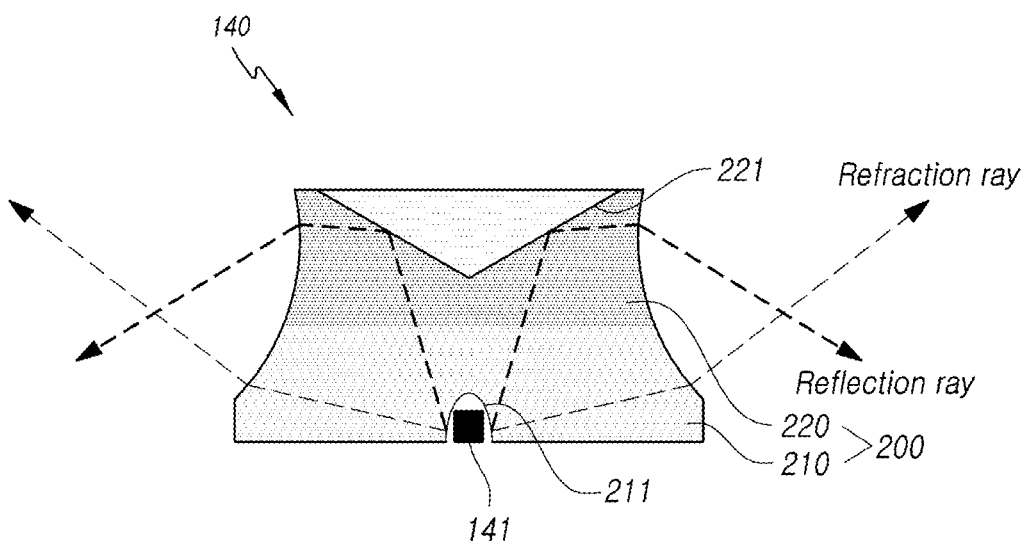
FIG. 11 is a view illustrating a third aspect of a lens structure having a light reflection characteristic and a light diffusion characteristic in the light source device according to aspects of the present disclosure and an example of a path through which light emitted from the light source moves.

FIG. 11 illustrates a third aspect of the structure of the hybrid lens 200 used in the light source device 140 according to the present aspects and a movement path of light.

Referring to FIG. 11, the hybrid lens 200 according to the third aspect includes a lower layer portion 210 having a light diffusion characteristic and an upper layer portion 220 having a light reflection characteristic.

The lower layer portion 210 may include, on the bottom surface thereof, a first concave portion 211 in which a light source 141 is disposed, and may include, on the outer surface thereof, a concave portion.

The upper layer portion 220 may include, on the top surface thereof, a second concave portion 221 for light reflection, and the outer surface of the upper layer portion 220 may have a concave shape.

Here, the curvature of the outer surface of the lower layer portion 210 and the curvature of the outer surface of the upper layer portion 220 may be different from each other. For example, the curvature of the outer surface of the upper layer portion 220 may be larger than the curvature of the outer surface of the lower layer portion 210.

When the light emitted from the light source 141 only passes through the region corresponding to the lower layer portion 210, the light is diffused by refraction on the outer surface of the lower layer portion 210 (refraction ray).

At this time, since the outer surface of the lower layer portion 210 has a concave shape, the light emitted from the light source 141 may be sent through a path different from the case of the hybrid lens 200 according to the first aspect or the second aspect.

In addition, when the light emitted from the light source 141 passes through regions corresponding to the lower layer portion 210 and the upper layer portion 220, the light is reflected by the second concave portion 221 of the upper layer portion 220 and is sent to the outside (reflection ray).

Here, since the outer surface of the upper layer portion 220 has a concave shape, the light passing through the outer surface of the upper layer 220 can be sent out with constant directivity.

That is, the hybrid lens 200 according to the third aspect includes the upper layer 220 having the light reflection characteristic, so that the outer surface of the lower layer portion 210 having the light diffusion characteristic can have a concave shape.

Therefore, it is possible to provide a hybrid lens 200 and a light source device 140 in which the outer surface of lower layer portion 210 having a light diffusion characteristic and the outer surface of the upper layer portion 220 having a light reflection characteristic are able to be variously configured, and which are able to simultaneously provide superior light diffusibility and light directivity.

Figure 12:
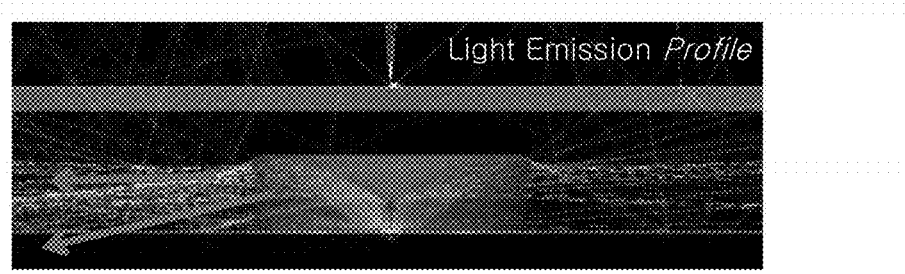
FIGS. 12 to 14 are views schematically illustrating light emission characteristics of the lens according to aspects of the present disclosure.
Figure 13:
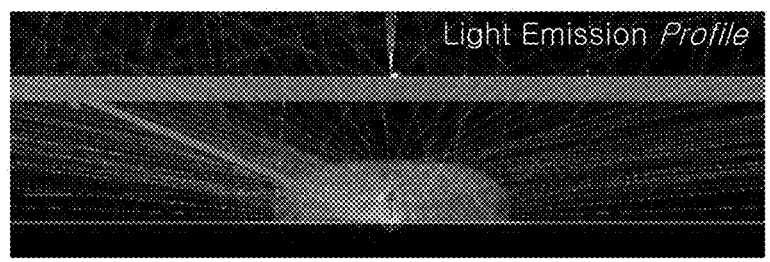
Figure 14:
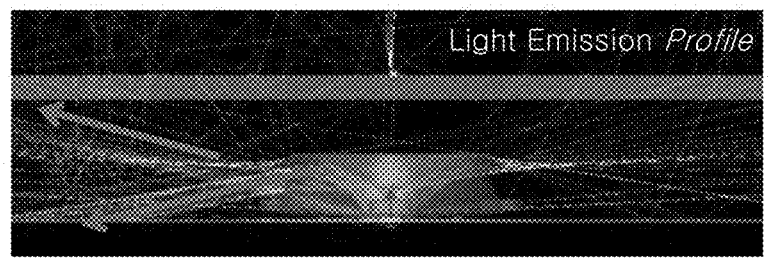

FIGS. 12 to 14 are views each schematically illustrating light emission characteristics of the lens according to aspects of the present disclosure.

FIG. 12 illustrates the light emission characteristics of the lens 142 having a light reflection characteristic, FIG. 13 illustrates the light emission characteristics of the lens 142 having a light diffusion characteristic, and FIG. 14 illustrates the light emission characteristics of the hybrid lens 200.

Referring to FIG. 12, the lens 142 having a light reflection characteristic reflects the light emitted from the light source 141 so as to send the light to the outside. Thus, the lens 142 exhibits an excellent light directional angle, but the light diffusibility tends to deteriorate.

Referring to FIG. 13, the lens 142 having a light diffusion characteristic refracts the light emitted from the light source 141 so as to send the light to the outside, thereby exhibiting excellent light diffusibility. However, when the lens 142, which is poor in light directional angle and has such a light diffusion characteristic is used in the backlight unit with a reduced optical gap, the image quality of the backlight unit may be degraded.

Referring to FIG. 14, the hybrid lens 200 refracts the light emitted from the light source 141 in the lower layer 210 so as to send the light to the outside, and reflects the light in the upper layer 220 so as to emit the light to the outside.

Therefore, the light emitted through the outer surface of the lower layer portion 210 exhibits a diffusion characteristic, and the light reflected from the second concave portion 221, which is the reflective surface of the upper layer portion 220, and emitted to the outside exhibits a reflection characteristic.

Accordingly, as illustrated in FIG. 14, when light is emitted through the hybrid lens 200, the light exhibits excellent characteristics in light diffusivity and light directional angle.

Figure 15:
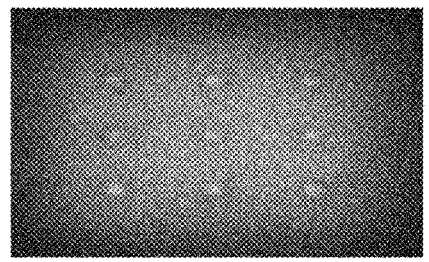
FIGS. 15 to 17 are views each illustrating the results of optical simulation of a backlight unit when the lens according to aspects of the present disclosure is used.
Figure 16:
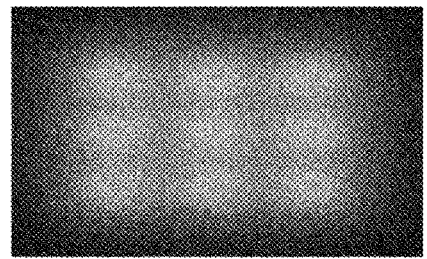
Figure 17:
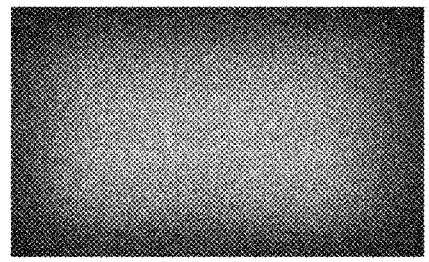

FIGS. 15 to 17 are views each illustrating the results of optical simulation of a backlight unit in which the lens according to aspects of the present disclosure is used.

FIG. 15 illustrates a case in which the simulation was performed using the lens 142 having a light reflection characteristic, FIG. 16 illustrates a case in which the simulation was performed using the lens 142 having a light diffusion characteristic, and FIG. 17 illustrates a result of simulation which was performed using the hybrid lens 200.

Referring to FIG. 15, when a lens 142 having a light reflection characteristic that is excellent in light directional angle but poor in light diffusibility is used, the exhibited brightness is low and the light is emitted unevenly.

Referring to FIG. 16, when a lens 142 which is excellent in light diffusion characteristic, is used, the exhibited brightness is high. However, since the light directional angle is reduced, the light is exhibited unevenly in the structure of the backlight unit in which the optical gap is reduced.

Referring to FIG. 17, when the optical simulation is performed using the hybrid lens 200, which is excellent in both light diffusivity and light directional angle, it can be seen that the light emitted from the light source device 140 is exhibited evenly even with the structure of the backlight unit with a reduced optical gap.

Figure 18:
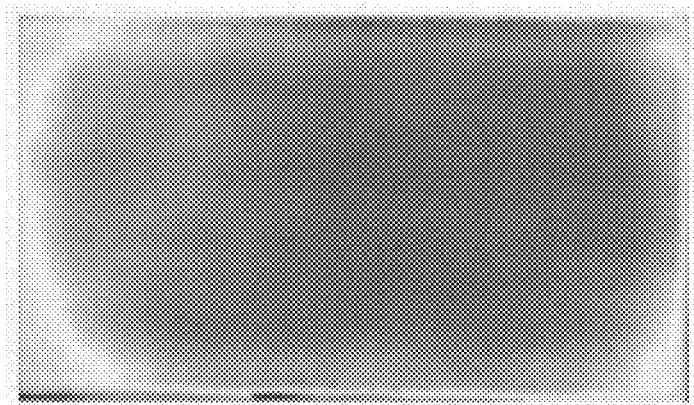
FIGS. 18 to 20 are views each illustrating the results of evaluating the image quality of a backlight unit when the lens according to aspects of the present disclosure is used.
Figure 19:
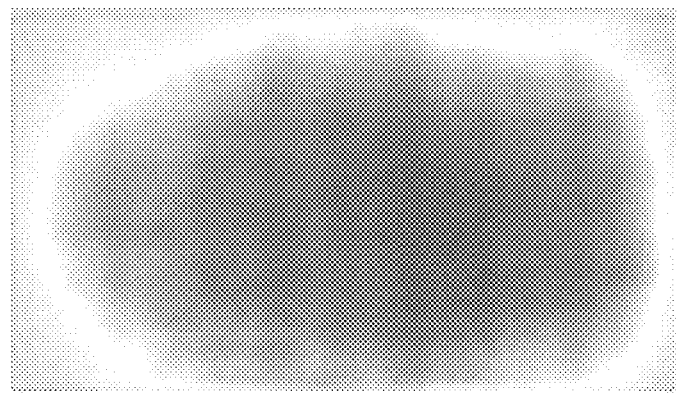
Figure 20:
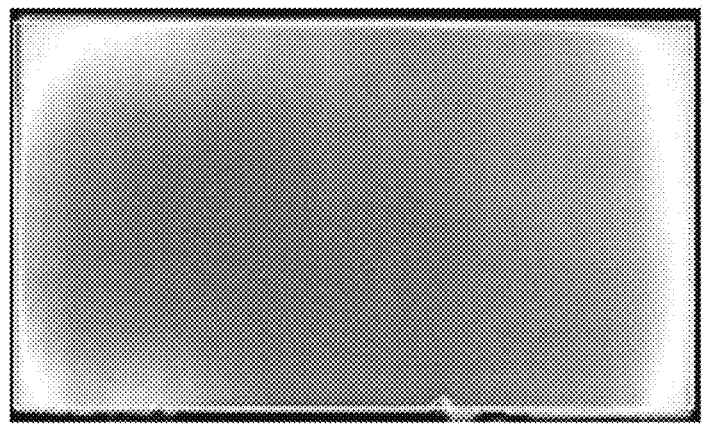

FIGS. 18 to 20 are views each illustrating the results of testing the image quality of a backlight unit in which the lens according to aspects of the present disclosure is used.

FIG. 18 illustrates the results of measurement of screen quality when a lens 142 having a light diffusion characteristic is used in the backlight unit having an optical gap of 30.5 mm.

It can be seen that the image quality is excellent when the lens 142 having the light diffusion characteristic is used in a structure having a large optical gap.

In contrast, FIG. 19 illustrates the results of measurement of image quality when a lens 142 having a light diffusion characteristic is used in the backlight unit having the optical gap of 15.0 mm, in which it can be seen that the image quality deteriorates as the optical gap decreases.

FIG. 20 illustrates image quality measured when the hybrid lens 200 is used in a backlight unit having an optical gap of 15.0 mm.

Referring to FIG. 20, it can be seen that even if the optical gap is reduced to 15.0 mm, when the hybrid lens 200 is used, the backlight unit exhibits evaluation results higher than the image quality measured by the backlight unit having an optical gap of 30.5 mm.

According to aspects of the present disclosure, the light source device 140 using the hybrid lens 200 is provided with the hybrid lens 200 including the lower layer portion 210 having a light diffusion characteristic and the upper layer portion 220 having a light reflection characteristic, so that the light source device can simultaneously provide light diffusibility and light directivity.

Accordingly, even in the case of a backlight unit with a reduced optical gap, the image quality of the backlight unit can be improved through the light source unit 140 that simultaneously provides light diffusion and light directivity.

Although aspects of the present disclosure has been described for illustrative purposes, those skilled in the art will appreciate that various modifications, additions and substitutions are possible, without departing from the scope and spirit of the disclosure as disclosed in the accompanying claims. Therefore, exemplary aspects of the present disclosure have been described for the sake of brevity and clarity. The scope of the present disclosure shall be construed on the basis of the accompanying claims in such a manner that all of the technical ideas included within the scope equivalent to the claims belong to the present disclosure.

What is claimed is:

1. A backlight unit comprising:
a light source;
a lens including a first concave portion defined on a bottom surface of the lens where the light source is disposed, and a second concave portion defined on a top surface of the lens,
wherein the light source emits refracted light to diffuse to outside in a region between a first point and a second point in a vertical direction and at least a part of the light emitted from the light source reflects to the outside in a region between the second point and a third point;
a diffuser plate disposed on the lens and spaced apart from the lens; and
a cover bottom accommodating the light source, the lens, and the diffuser plate,
wherein a lowest point of the second concave portion is located between the second point and the third point, and
wherein the lens includes an outer surface having a first curvature and a second curvature opposite to the first curvature, and the first curvature changes to the second curvature at a middle point of the lens.

2. The backlight unit of claim 1, wherein the lens includes the outer surface having a convex shape between the first point and the second point and a concave shape between the second point and the third point.

3. The backlight unit of claim 1, wherein the lens includes an outer surface having a concave portion between the first point and the second point and a concave shape between the second point and the third point, and a first curvature between the first point and the second point and a second curvature between the second point and the third point, wherein the first and second curvatures are different from each other.

4. The backlight unit of claim 1, wherein the lens has the first curvature of the outer surface changing at the second point, and has a point where the second curvature of the outer surface changes between the second point and the third point.

5. The backlight unit of claim 4, wherein the point where the second curvature of the outer surface changes between the second point and the third point is located higher than the lowest point of the second concave portion.

6. The backlight unit of claim 1, wherein the second concave portion has an entire surface located lower than the third point.

7. A lens for a light source device, the lens comprising:
a lower layer portion having a light-incident portion to receive light emitted from a light source and an outer surface having a convex shape; and
an upper layer portion positioned on the lower layer portion and having an outer surface having a concave shape, wherein the upper layer portion has a reflective surface being inclined inward or concave on at least a part of a top surface,
wherein a lowest position of the reflective surface is located between the point and the top surface of the upper layer portion, and
wherein the outer surface has a first curvature and a second curvature opposite to the first curvature, and the first curvature changes to the second curvature at a middle point of the lens.

8. The lens of claim 7, wherein the lower layer portion refracts the light incident through the light-incident portion on the outer surface and diffuses the light outward.

9. The lens of claim 7, wherein the upper layer portion reflecting at least a part of the light incident through the light-incident portion from the reflective surface and sending out the light from the outer surface.

10. The lens of claim 7, wherein the lens has a point where the second curvature of the outer surface of the upper layer portion changes, and the point is located higher than a lowest position of the reflective surface.

11. A lens for a light source device, the lens comprising:
a light-incident portion disposed on a bottom surface of the lens and receiving light emitted from a light source;
a reflective surface disposed on a top surface of the lens and inwardly inclined or concave; and
an outer surface emitting the light incident on the light-incident portion,
wherein the outer surface includes a first outer surface having a first curvature and a second outer surface having a second curvature, and the first and second curvatures different from each other,
wherein the light source emits refracted light to diffuse to outside in a region between a first point and a second point in a vertical direction and at least a part of the light emitted from the light source reflects to the outside in a region between the second point and a third point, and
wherein a lowest point of the reflective surface is located between the second point and the third point, and
wherein the first curvature and the second curvature are opposite to each other, and the first curvature changes to the second curvature at a middle point of the lens.

12. The lens of claim 11, wherein a part of the light received at the light-incident portion is reflected from the reflective surface and is emitted through the second outer surface, and another part of the light received at the light-incident portion is emitted through the first outer surface.

13. The lens of claim 11, wherein the outer surface having a convex shape between the first point and the second point and a concave shape between the second point and the third point.

14. The lens of claim 11, wherein the outer surface having a concave portion between the first point and the second point and a concave shape between the second point and the third point, and a first curvature between the first point and the second point and a second curvature between the second point and the third point.

15. The lens of claim 11, wherein the outer surface has the first curvature changing at the second point, and has a point where the second curvature of the outer surface changes between the second point and the third point.

16. The lens of claim 15, wherein the point where the second curvature of the outer surface changes between the second point and the third point is located higher than a lowest point of the second concave portion.

17. The lens of claim 16, wherein the lowest point of the second concave portion is located between the second point and the third point.

18. The lens of claim 11, wherein the second concave portion has an entire surface located lower than the third point.

19. The lens of claim 11, wherein the first curvature has a convex shape and the second curvature has a concave shape.

* * * * *